United States Patent
Choi et al.

(10) Patent No.: US 7,230,251 B2
(45) Date of Patent: Jun. 12, 2007

(54) ELECTRON BEAM LENS FOR MICRO-COLUMN ELECTRON BEAM APPARATUS AND METHOD OF FABRICATING THE SAME

(75) Inventors: Sang Kuk Choi, Daejeon (KR); Dae Yong Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 202 days.

(21) Appl. No.: 11/174,891

(22) Filed: Jul. 1, 2005

(65) Prior Publication Data
US 2005/0266322 A1 Dec. 1, 2005

Related U.S. Application Data

(62) Division of application No. 10/817,779, filed on Apr. 2, 2004, now Pat. No. 6,996,896.

(30) Foreign Application Priority Data

Oct. 25, 2003 (KR) ............................... 2003-74927

(51) Int. Cl.
*H01J 37/12* (2006.01)
(52) U.S. Cl. ................... 250/396 R; 445/46; 29/825
(58) Field of Classification Search ............ 250/396 R; 29/825; 445/46; 216/40, 72; 427/97.1–97.9
See application file for complete search history.

(56) References Cited

U.S. PATENT DOCUMENTS

| | | | | |
|---|---|---|---|---|
| 5,444,256 A | * | 8/1995 | Nagai et al. | 250/396 R |
| 5,535,508 A | * | 7/1996 | Nagai et al. | 29/825 |
| 5,731,228 A | * | 3/1998 | Endo et al. | 438/20 |
| 6,996,896 B2 | * | 2/2006 | Choi et al. | 29/825 |
| 2005/0087696 A1 | * | 4/2005 | Choi et al. | 250/396 R |
| 2005/0263712 A1 | * | 12/2005 | Choi et al. | 250/396 R |
| 2005/0266322 A1 | * | 12/2005 | Choi et al. | 430/5 |

OTHER PUBLICATIONS

J. Vac. Sci. Technol. B 12(b) Nov./Dec. 1994, pp. 3425-3430.

* cited by examiner

*Primary Examiner*—John R. Lee
(74) *Attorney, Agent, or Firm*—Blakely Sokoloff Taylor & Zafman

(57) ABSTRACT

Provided is an electron beam lens for a micro-column electron beam apparatus and a method of manufacturing the same. A photosensitive glass substrate is used as a base isolation substrate and a thin metal film is grown by a plating method. Holes through which electron beam passes are formed by a lift off method after forming a resist pattern shaped as a hole on a seed metal layer and plating the thin metal film.

5 Claims, 7 Drawing Sheets

ELECTRON BEAM LENS FOR MICRO-COLUMN ELECTRON BEAM APPARATUS AND METHOD OF FABRICATING THE SAME

The present patent application is a Divisional of application Ser. No. 10/817,779, filed Apr. 2, 2004 now U.S. Pat. No. 6,996,896.

BACKGROUND OF THE INVENTION

This application claims the priority of Korean Patent Application No. 2003-74927 filed on Oct. 25, 2003, in the Korean Intellectual Property Office, the disclosure of which is incorporated herein in its entirety by reference.

1. Field of the Invention

The present invention relates to an electron beam lens of a micro-column electron beam apparatus used for an electron beam exposure process of a semiconductor manufacturing process and a method of fabricating the same.

2. Description of the Related Art

A micro-column electron beam apparatus is used for patterning a semiconductor device as designed by focusing an electron beam generated at a cathode onto a resist film coated on a semiconductor wafer or a mask. The micro-column electron beam apparatus includes a deflector and electron beam lenses such as a source lens and a focus lens.

A deflector disposed between the electron beam lenses of the micro-column electron beam apparatus electrically controls the direction of the electron beam generated at the cathode such that the electron beam is projected onto the wafer or mask according to design data received from a pattern generator.

An electron beam lens of the micro-column electron beam apparatus includes a plurality of sequentially stacked thin conductive films in which a base isolation substrate is disposed between the conductive films. A hole through which the electron beam passes is formed at a center of each of the conductive thin films. Each of the base isolation substrates that acts as an insulator to maintain a uniform distance between adjacent conductive thin films, has a hollowed space which is larger than the hole through which the electron beam passes. The electron beam passing through is focused or dispersed by an electric potential applied to the conductive thin films as it passes through the holes in the central portion of the conductive thin films.

In a conventional method of manufacturing the electron beam lens, the conductive thin films are manufactured separately with a thickness of several µm and attached to both sides of an individual substrate such as pyrex glass using an anodic bonding method. The conductive thin film is a conductive silicon thin film including a boron doped layer on a wafer or a thin metal sheet of chrome, wherein the conductive silicon thin film is formed by forming a boron doped layer on a silicon wafer that has a thickness of 0.2~1 mm, forming a membrane on by etching backside of the silicon wafer, and then forming a hole by reactive ion etching process that leaves the boron doped layer on the wafer.

In order to manufacture an electron beam lens capable of focusing or dispersing the electron beams as intended, the conductive thin films must be parallel and the holes must be positioned accurately with respect to the central portion during a stacking process of the conductive thin films. However, in the prior art, parallel arrangement of the conductive thin films and the in-line alignment of the holes is very difficult because each conductive film is separately manufactured and stacked. Particularly, a required bonding technique is very complicated and troublesome. Therefore, the conventional method of manufacturing an electron beam lens has poor reproducibility and produces lenses with a weak mechanical structure.

SUMMARY OF THE INVENTION

The present invention provides an electron beam lens which provides a superior performance since thin conductive films are arranged in parallel, holes are correctly self-aligned, and holes have uniform shapes.

The present invention also provides a method of manufacturing an electron beam lens in which conductive thin films having holes that are self aligned.

According to an aspect of the present invention, there is an electron beam lens of a micro-column electron beam apparatus comprising a plurality of conductive thin films, each having a hole through which electron beam passes; and a plurality of base isolation substrates disposed between the conductive thin films, each of the base isolation substrate having hollowed spaces larger than the holes, wherein the base isolation substrates are photosensitive glass substrates in which the hollowed spaces are formed by etching activated regions formed by exposing to light, the conductive thin films are metal plating layers grown on the base isolation substrates, the photosensitive glass, and the holes are each formed by forming a resist pattern on the base isolation substrate along a central line of an electron beam path, growing the metal plating layer on the base isolation substrate, and then performing a lift-off method to remove the resist pattern, so that the holes are self aligned along the central line of an electron beam path.

According to another aspect of the present invention, there is a method of manufacturing an electron beam lens comprising focusing a light onto a region with a shape of a hollowed space to form an activated region in a central portion of a photosensitive glass substrate; forming a seed metal layer on at least one surface of the photosensitive glass substrate; forming a resist pattern with a shape of a hole on the central portion of the seed metal layer; forming a plating layer on a region of the seed metal layer exposed resist pattern; removing the resist pattern using a lift off process; forming a thin metal film having a hole on the photosensitive glass substrate by removing a portion of the seed metal layer that has covered by the resist pattern; and forming a hollowed space by etching the activated region of the photosensitive glass substrate.

In the method of manufacturing the electron beam lens according to the present invention, a plurality of the photosensitive glass substrates can be bonded together after forming a thin metal film having a hole on each of the photosensitive glass substrates. The activated portions of the photosensitive glass substrate can then be removed simultaneously or one by one to form hollowed spaces between the plurality of conductive thin metal films. In this manner, an electron beam lens or an electron beam module structure with a stack of photosensitive glass substrates between thin metal films can be manufactured.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
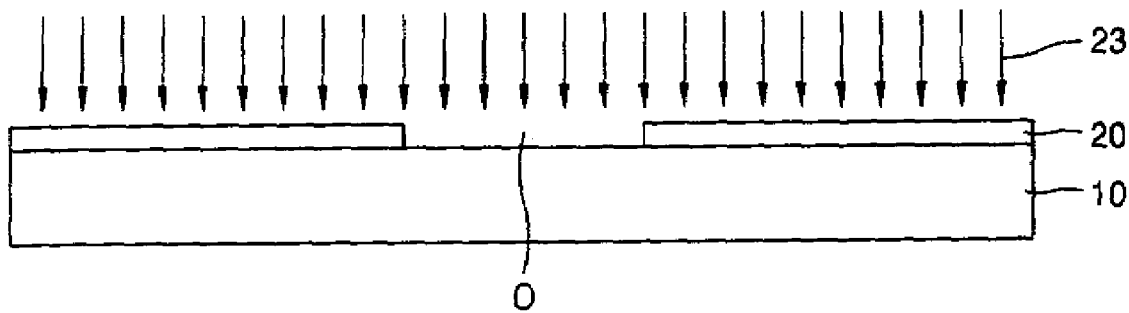
FIGS. 1 through 12 are cross-sectional views illustrating a method of manufacturing an electron beam lens, according to a first exemplary embodiment of the present invention.

Hereinafter, exemplary embodiments of the present invention will be described more fully with reference to the accompanying drawings. This invention may, however, be embodied in many different forms and should not be construed as being limited to the embodiments set forth herein. Rather, these embodiments are described herein so that this disclosure will be thorough, complete, and fully convey the concept of the invention to those skilled in the art. In the drawings, the thicknesses of films and regions may be exaggerated for clarity. To facilitate understanding, identical reference numerals have been used, where possible, to designate identical elements that are common to the figures.

In an exemplary embodiment of the present invention, a method of manufacturing an electron beam lens with a structure including three thin metal films and two base isolation substrates, which is a representative structure of a source lens and a focus lens, will be described. However, it is understood that the method of forming an electron beam lens according to the present invention is applicable to manufacturing stacking structures with more or less thin metal films and base isolation substrates.

FIGS. 1 through 12 are cross-sectional views illustrating a method of manufacturing an electron beam lens according to a first exemplary embodiment of the present invention.

A squared photosensitive substrate having a thickness of 100~500 μm is used for a base isolation substrate. Referring to FIG. 1, a photosensitive mask 20 is formed on a central portion of a first photosensitive glass substrate 10, upper and lower surfaces of which are planarized. The photosensitive mask 20 is formed on the first photosensitive glass substrate 10 with an opening O that has a circular shape with a diameter of 2 to 3 mm or a square shape with a side length of 2 to 3 mm, to form a first hollowed space. The first photosensitive glass substrate 10 covered by the photosensitive mask 20 is exposed to ultraviolet light 23.

Figure 2:
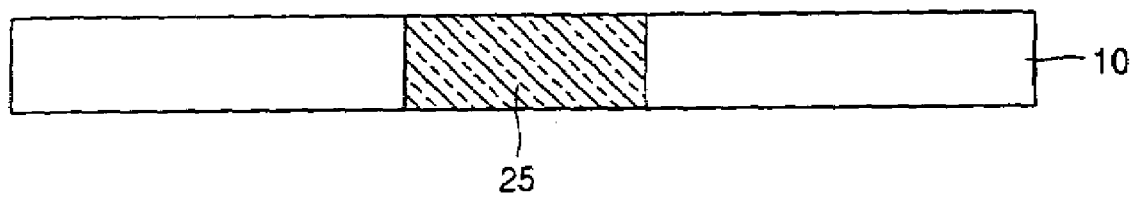

FIG. 2 illustrates the structure after the photosensitive mask 20 is removed and an activation treatment is performed. Referring to FIG. 2, an activated portion 25 as a circular shape with a diameter of 2 to 3 mm or a square shape with a side length of 2 to 3 mm is formed on a central portion of the first photosensitive glass substrate 10. The shape of an activated portion 25 may vary according to the shape of the opening O and the method of exposure. For example, the shape of the activated portion can be a cylinder, a square column, or a head-cut pyramid or cone. The activated portion 25 can be readily defined by controlling the shape of the opening O and the method of exposure since the substrate is formed of photosensitive glass.

Figure 3:
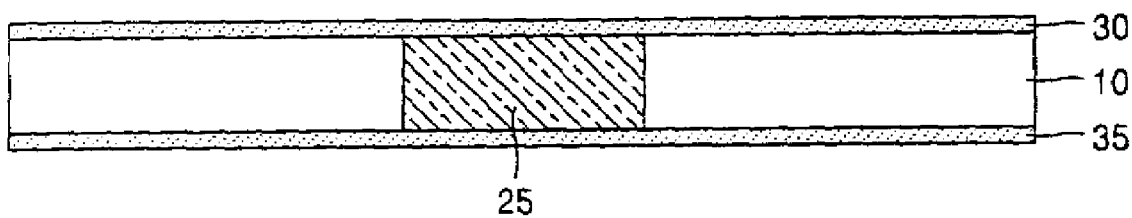

Referring to FIG. 3, a first and a second seed metal layer 30 and 35 required for metal plating are formed on the upper and lower surfaces of the photosensitive glass substrate 10, respectively. The first and the second seed metal layers 30 and 35 increase a uniformity of plating and acts as initial nucleation sites. The thicknesses of the first and the second seed metal layers 30 and 35 can be chosen appropriately. A deposition may be performed by a sputtering method, but a CVD method can also be used. The seed metal can be one of a metal selected from a group consisting of Cu, Au, Ag, Pt or Pd, but can also be selected according to a metal used for plating or a method of plating used.

Figure 4:
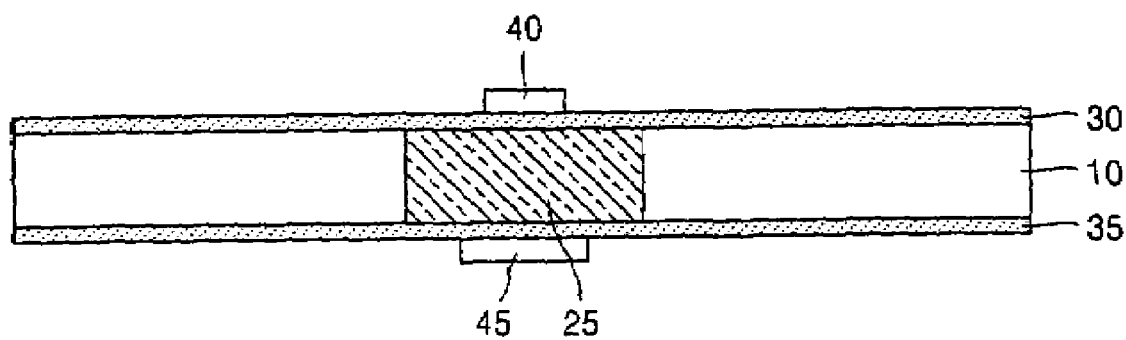

Referring to FIG. 4, a resist film is coated on the first seed metal layer 30, and exposed to a light using a mask (not shown) with a shape of a first hole. Then, the resist film, except a resist pattern 45 with the shape of the first hole, is removed using a photolithography process that develops and bakes the resist film, leaving the first seed metal layer 30 partially exposed. In the same manner, a resist film is coated on the second seed metal layer 35, and exposed to a light by a double side exposure apparatus using a mask (not shown) with a shape of a second hole. Then, the resist film, except the resist pattern 45 with a shape of the second hole, is removed using a photolithography process, leaving the second seed metal layer 35 partially exposed.

The resist pattern 45 with the shape of the second hole is formed by aligning with the resist pattern 40 with the shape of the first hole. The resist patterns 40 and 45 have a circular shape with a diameter of 0.5 to 200 μm, and define a hole through which electron beam passes. The double side exposure apparatus is used for forming the resist pattern 45 with the shape of the second hole on the lower surface of the substrate, and the pattern 45 is aligned to the pattern 40 with the shape of the first hole.

Figure 5:
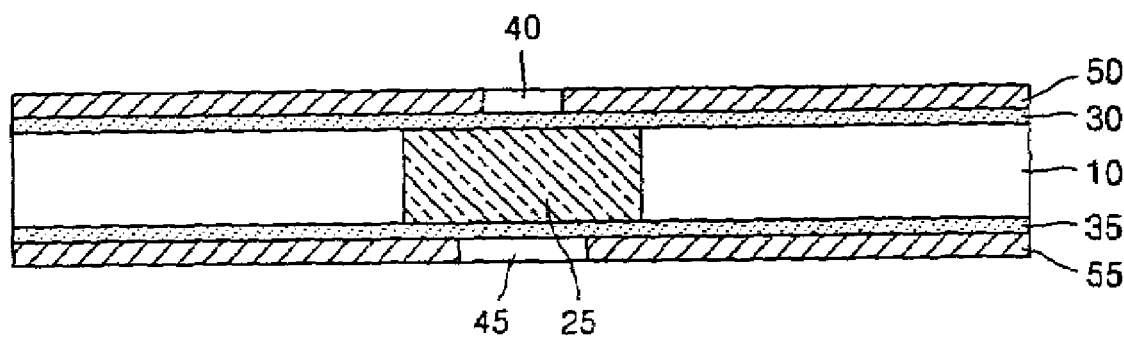

Referring to FIG. 5, the resultant structure is plated. The plating can be performed by an electroplating method or an electroless plating method. The electroplating method has a high plating efficiency and a rate of plating can be controlled easily, but is a complex process and requires a complex apparatus. On the other hand, the electroless plating method has a higher filling characteristic than the electroplating method, but has a low plating efficiency and it is difficult to control rate of plating. The electroplating method is more suitable for the exemplary embodiment of the present invention, but not limited thereto.

The plating process can be performed as follows. A first metal plating layer 50 is formed on the first seed metal layer 30 on which the resist pattern 40 with the shape of the first hole is formed, and a second metal plating layer 55 is formed on the second seed metal layer 35 on which the resist pattern 45 with the shape of the second hole is formed. The first and the second metal plating layers 50 and 55 are grown on the portions of the surfaces of the first and the second seed metal layers 30 and 35 exposed by the resist patterns 40 and 45 with the shapes of the first and the second holes. A thickness of the plating can be set as required, but it is preferably 2 to 35 μm. The plating layers can be made of copper, a copper alloy, stainless steel, nickel, gold, silver, or platinum. However, it is understood that these metals are exemplary materials and that all metals that are consistent with the purpose of the present invention can be used. Plating can be performed using a conventional method. For example, to plate copper using the electroplating method, a plating solution can be an aqueous solution that provides $2^+$ copper ions such as an aqueous copper sulfuric acid solution ($CuSO_4 \cdot 5H_2O$), sulfuric acid ($H_2SO_4$) solution, or hydrochloric acid (HCl) solution.

Figure 6:
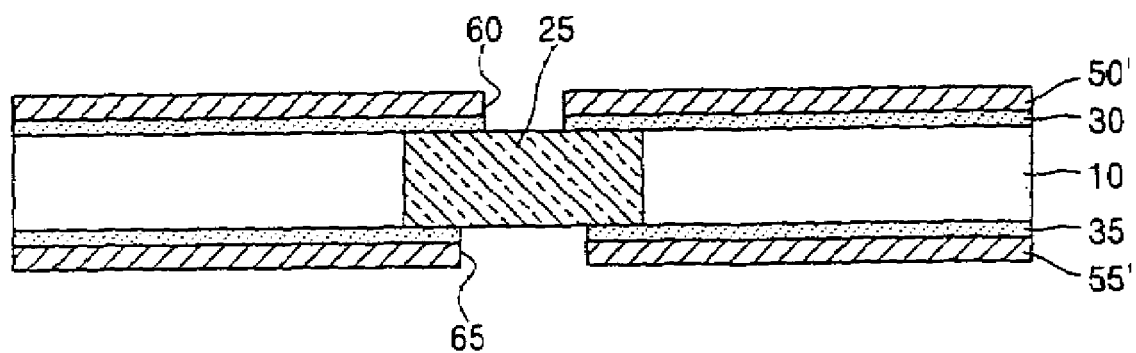

Referring to FIG. 6, a lift off process for removing the resist patterns 40 and 45 with the shapes of the first and the second holes is performed. The lift off process is performed by a wet method that uses an organic solvent to remove a resist material. Next, portions of the seed metal layers 30 and 35 covered by the resist patterns 40 and 45 with the shapes of the first and the second holes are removed. Thus, a first metal thin film 50' having a first hole 60 on the upper surface of the photosensitive glass substrate 10 and a second metal thin film 55' having a second hole 65 on the lower surface of the photosensitive glass substrate 10 are formed. The first and the second holes 60 and 65 are formed in the same location as the resist patterns 40 and 45 are self aligned by the double side exposure apparatus. Accordingly, an electron beam lens capable of controlling the focusing or dispersion of the electron beam can be manufactured. Since the first and second holes 60 and 65 are respectively formed in the same locations as the resist patterns 40 and 45 are formed, a hole with a correct concentricity and eccentricity and well defined shape is formed compared to a hole formed by a conventional method in which the hole is perforated after forming the individual conductive thin films. Accordingly, a superior quality of electron beam lens can be manufactured.

Figure 7:
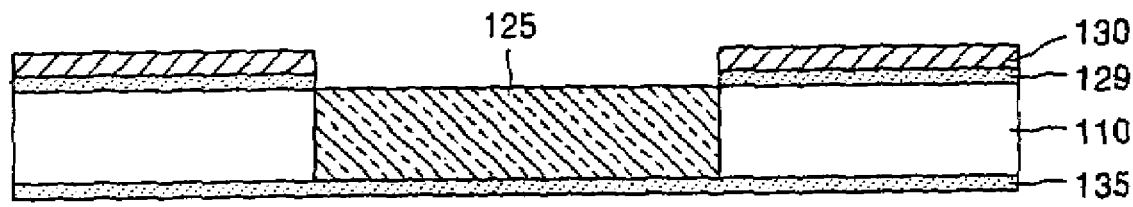

Referring to FIG. 7, a second photosensitive glass substrate 110 that has planarized upper and lower surfaces is prepared. The second photosensitive glass substrate 110 can be prepared as a similar method as described with reference to FIGS. 1 through 6. First, activated portion 125 with a shape of a second hollowed space is prepared by exposing a central portion of the second photosensitive glass substrate 110 to UV light. The activated portion 125 with the shape of the second hollowed space can be a circle with a diameter of 2 to 3 mm or a square with a side line of 2 to 3 mm, however, it can be formed to be the same size and/or shape as the activated portion 25, or it can be formed to be bigger or smaller than the activated portion 25. Next, a thin metal plating layer 130 and a third seed metal layer 135 are formed on the upper and lower surfaces of the second photosensitive glass substrate 110, respectively. As illustrated in FIG. 7, the thin metal plating layer 130 can be formed on a seed metal layer 129. Alternatively, the thin metal plating layer 130 can be the seed metal layer itself. The thin metal plating layer 130 can be formed of a metal selected from a group consisting of copper, a copper alloy, stainless steel, nickel, gold, silver, or platinum. The thin metal plating layer 130 exposes the activated portion 125.

Figure 8:
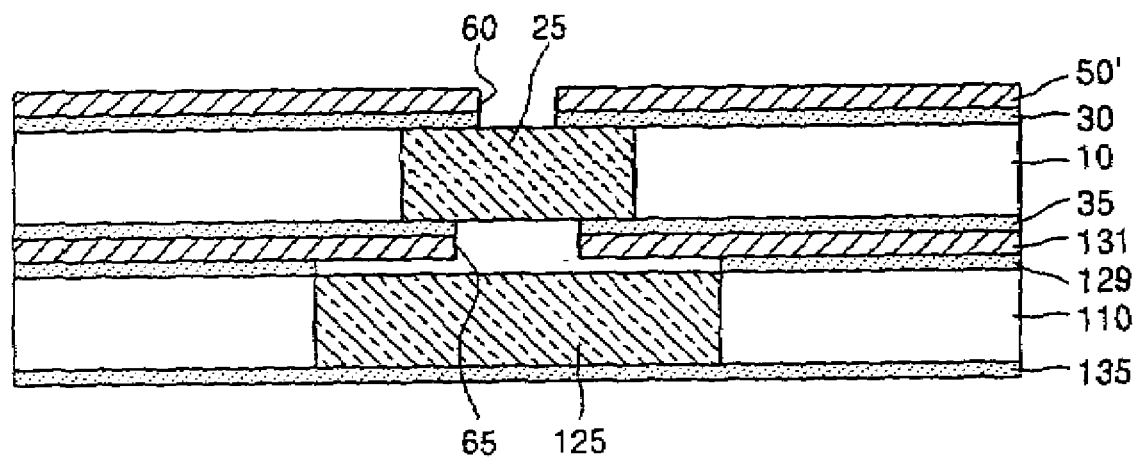

Referring to FIG. 8, the structures of FIG. 6 and the FIG. 7 are combined. That is, the second thin metal film 55' on the lower surface of the first photosensitive glass substrate 10 and the thin metal plating layer 130 on the upper surface of the second photosensitive glass substrate 110 are bonded using a eutectic bonding method. Then, the second thin metal film 55', and the thin metal plating layer 130 constitute a thin metal film 131. A bonding procedure used can be altered as necessary. For example, the second photosensitive glass substrate 110 can be bonded to the second thin metal film 55' on the first photosensitive glass substrate 10 using a bonding material such as a glass paste, instead of bonding thin metal plating layer 130 to the second photosensitive glass substrate 110.

Figure 9:
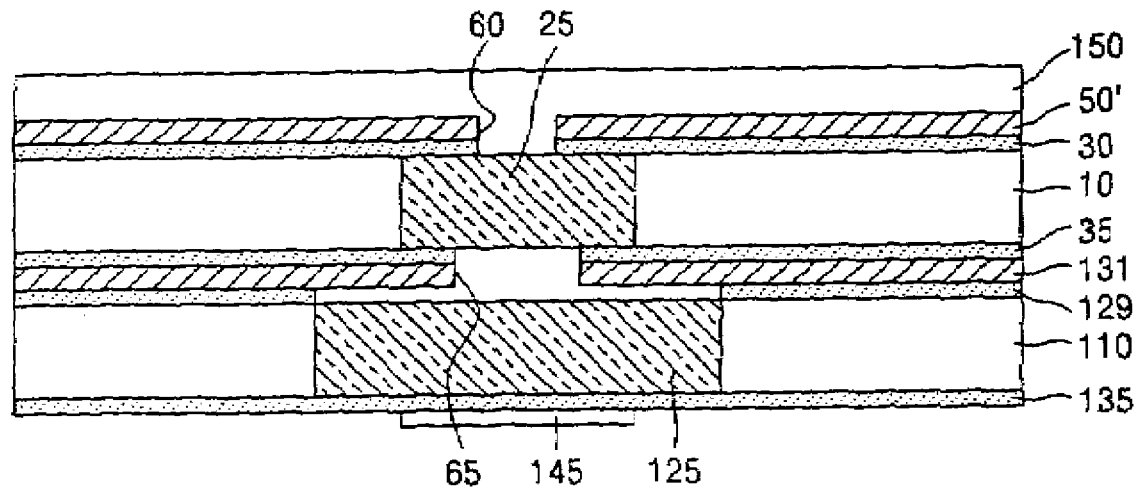

Next, referring to FIG. 9, a resist pattern 145 with a shape of a third hole that is aligned to the first and second holes 60 and 65 is formed on the third seed metal layer 135. A surface on which the first thin metal film 50', the first hole 60, and the activated region 25 are formed, is protected by a resist film 150, and the resist pattern 145 with the shape of the third hole is formed on the opposite surface on which the third seed metal layer 135 is formed, by a photolithography process using a predetermined mask. A diameter of the resist pattern 145 can be 0.5 μm to a few 100 μm. Preferably, a double side exposure apparatus for aligning is used. The double side exposure apparatus forms the resist pattern 145 with the shape of the third hole aligned to the first hole 60 by the double side exposure apparatus.

Figure 10:
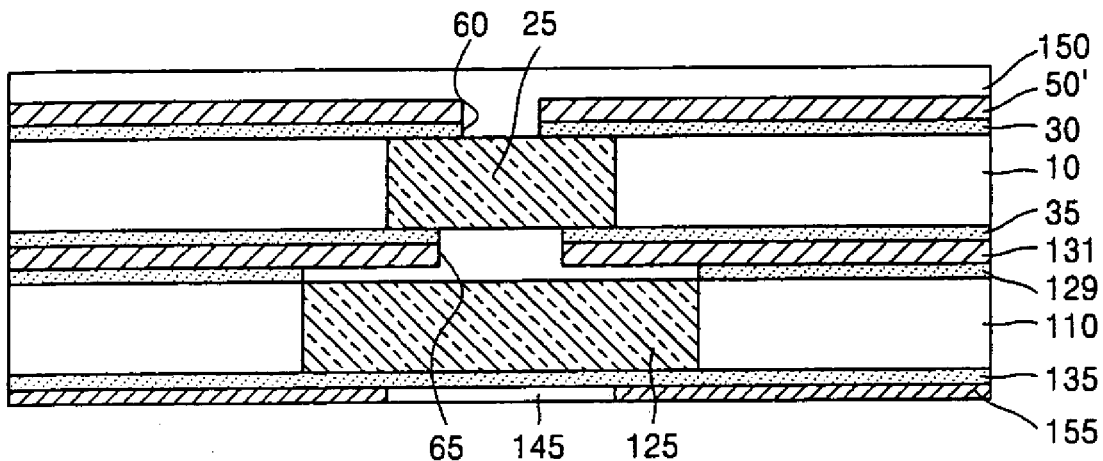

Referring to FIG. 10, a third metal plating layer 155 is formed on a portion of the third seed metal layer 135 exposed by the resist pattern 145. The third metal plating layer 155 can be formed of a metal selected from a group consisting of copper, a copper alloy, stainless steel, nickel, gold, silver, or platinum.

Figure 11:
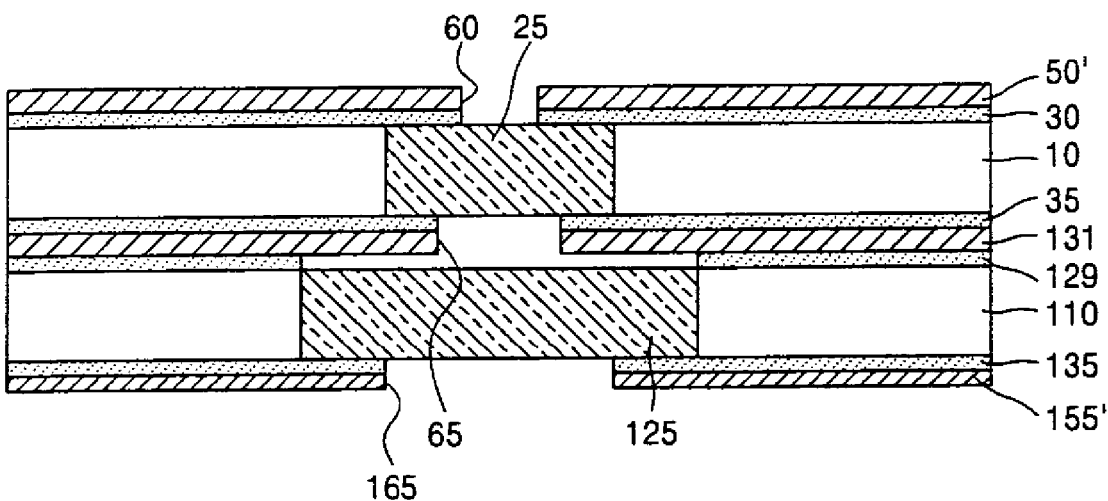

Referring to FIG. 11, the resist pattern 145 is removed by a lift off process. At this time, the resist film 150 is also removed. A third thin metal film 155' having a third hole 165 is formed by removing a portion of the seed metal layer covered by the resist pattern 145 with the shape of the third hole 165 from the lower surface of the second photosensitive glass substrate 110. The third hole 165 is formed at the same location as the resist pattern 145, which aligned with the first hole by the double side exposure apparatus.

Figure 12:
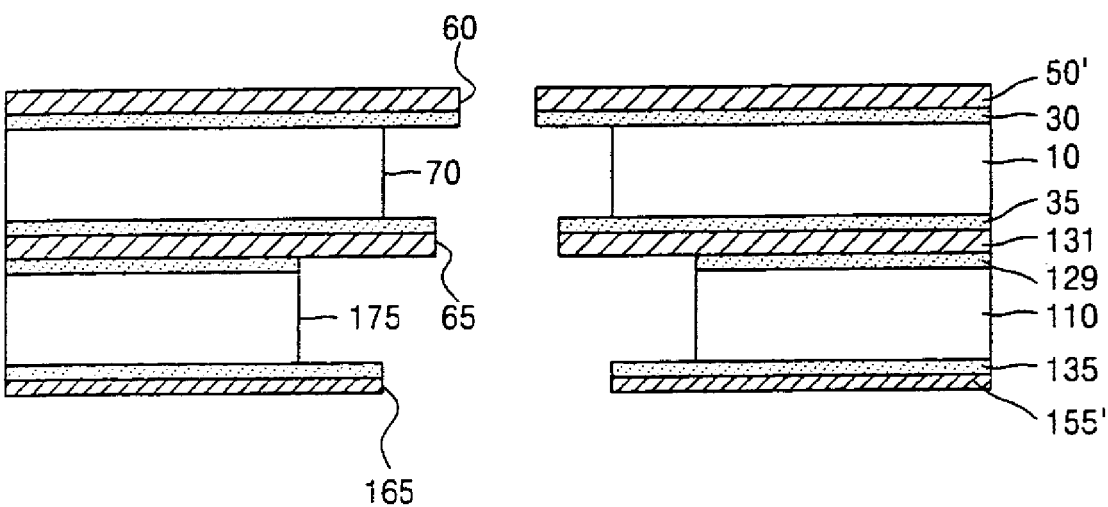

Referring to FIG. 12, a first and a second hollowed space 70 and 175 are formed by wet etching the activated portion 25 of the first photosensitive glass substrate 10 and the activated portion 125 of the second photosensitive glass substrate 110. The activated portion can be removed by, for example, a wet etching method using a fluoric acid solution.

According to the foregoing exemplary embodiment, an electron beam lens having three of thin metal film layers, i.e., the first thin metal film 50', the thin metal film 131 in the bonding region, and the third thin metal film 155', and two of base isolation substrates, i.e., the first and the second photosensitive glass substrates 10 and 110 can be manufactured. Referring to FIG. 12, the holes 60, 65, and 165 through which an electron beam passes, located in the central portion of the electron beam lens are self aligned. The thin metal films, i.e., the first thin metal film 50', the thin metal film 131 at the bonding region, and the third thin metal film 155' are need not be bonded to the base isolation substrates as in the conventional method because the thin metal films are directly grown on the first or the second photosensitive substrate 10 and 110. Therefore, troublesome work for accurately positioning the holes of the thin metal films and the substrates with respect to the center of axis of electron beam is not required. Therefore, the easy manufacturing due to easy aligning results in improved productivity and a superior quality of lens.

The main features of the present invention are that a photosensitive glass substrate is used for the base isolation substrate, the thin metal film is grown by a plating process, and the holes through which electron beam passes are aligned by the double side exposure techniques.

In the above exemplary embodiment, the first and the second hollowed spaces 70 and 175 are formed simultaneously by a single wet etching process, but the first hollowed space 70 can be formed immediately after performing the steps illustrated in FIGS. 1 through 6. That is, the hollowed spaces can be formed simultaneously or one by one.

In the first exemplary embodiment of the present invention, the thin metal films are formed on both the upper and lower surfaces of the photosensitive glass substrate 10. However, the formation of the thin metal film can be formed on a single surface of the photosensitive glass substrate using the metal plating and the lift off method.

Figure 13:
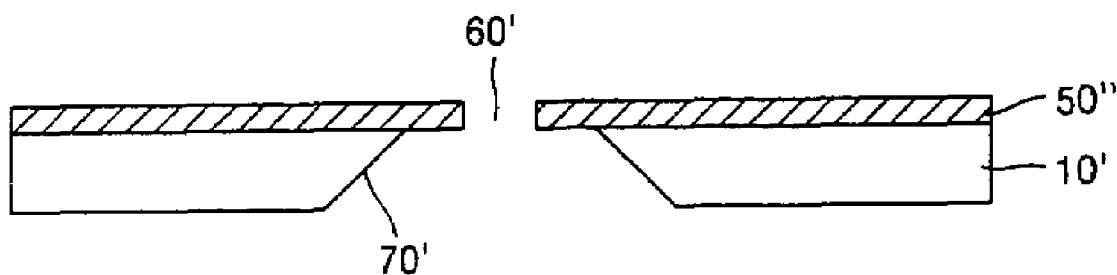
FIG. 13 is a cross-sectional view of a modified electron beam lens according to the present invention.
Figure 14:
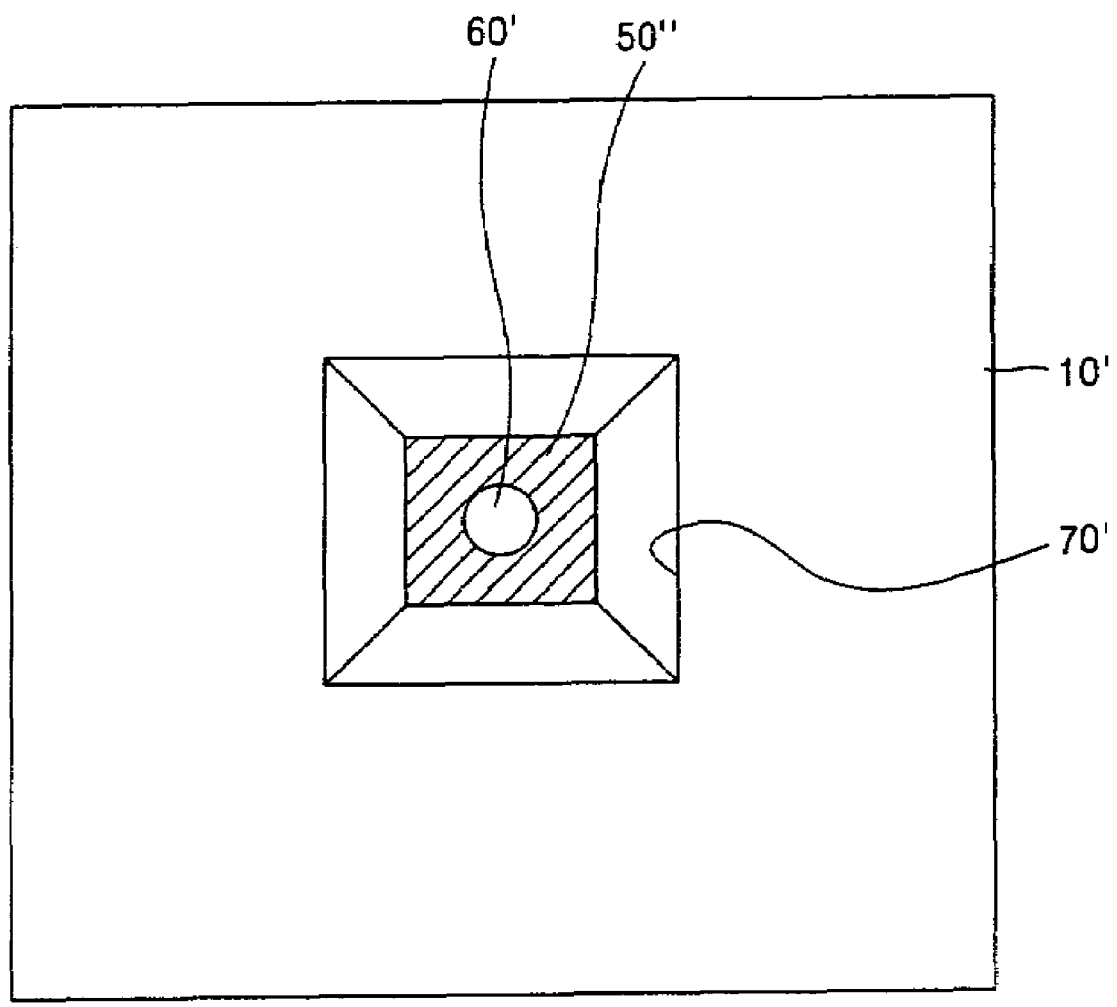
FIG. 14 is a bottom plane view of the electron beam lens illustrated in FIG. 13.
Figure 15:
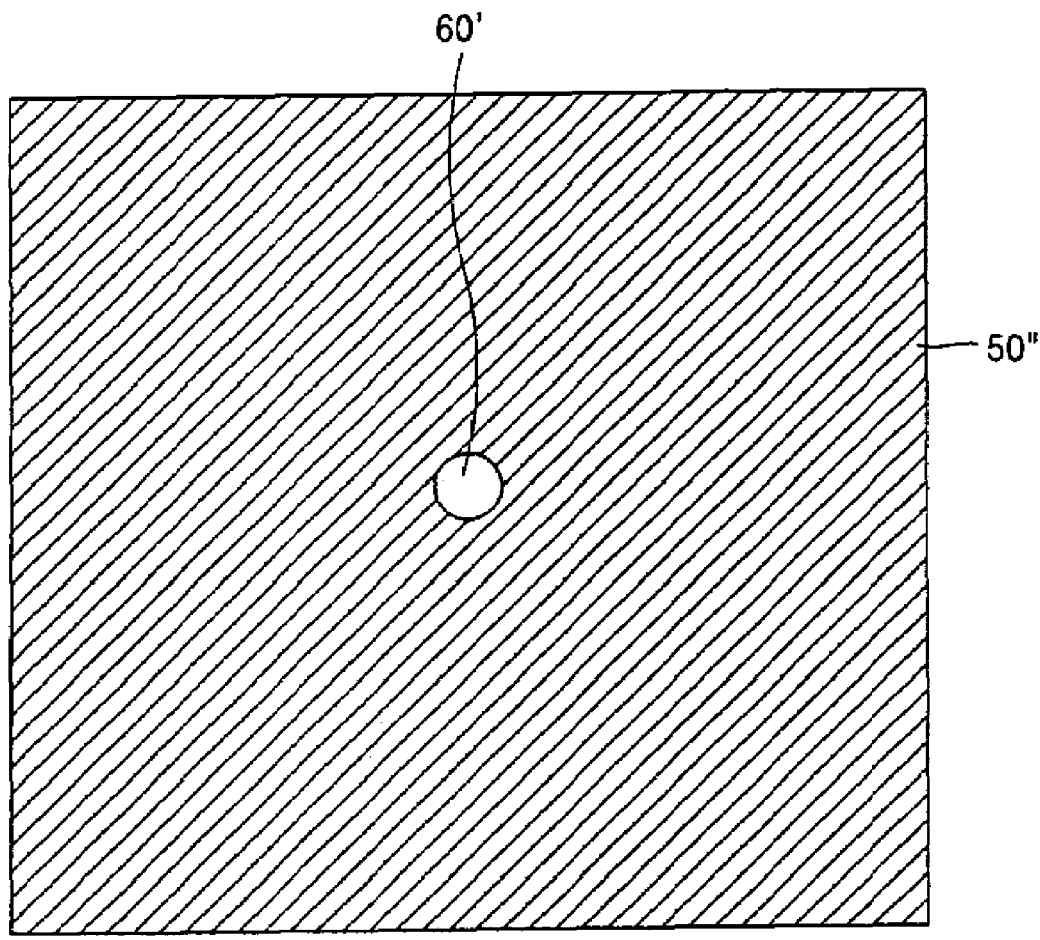
FIG. 15 is top-plane view of the electron beam lens illustrated in FIG. 13.

FIG. 13 is a cross-sectional view of an electron beam lens with a thin metal film only a face of the photosensitive glass substrate. Referring to FIG. 13, a thin metal film 50" having a hole 60' can be formed on a photosensitive glass substrate 10' having a hollowed space 70'. FIG. 14 is a bottom plane view of an electron beam lens of FIG. 13 taken from the photosensitive glass substrate 10' and FIG. 15 is a top plane view of the electron beam lens of FIG. 13.

As described above, the hollowed space formed by exposing the photosensitive glass substrate to a light can have a variety of shapes according to the shape of the opening of the photosensitive mask 20 in FIG. 1 and the method of exposing. The hollowed space depicted in FIGS. 13 and 14 has a head-cut pyramid shape.

Figure 16:
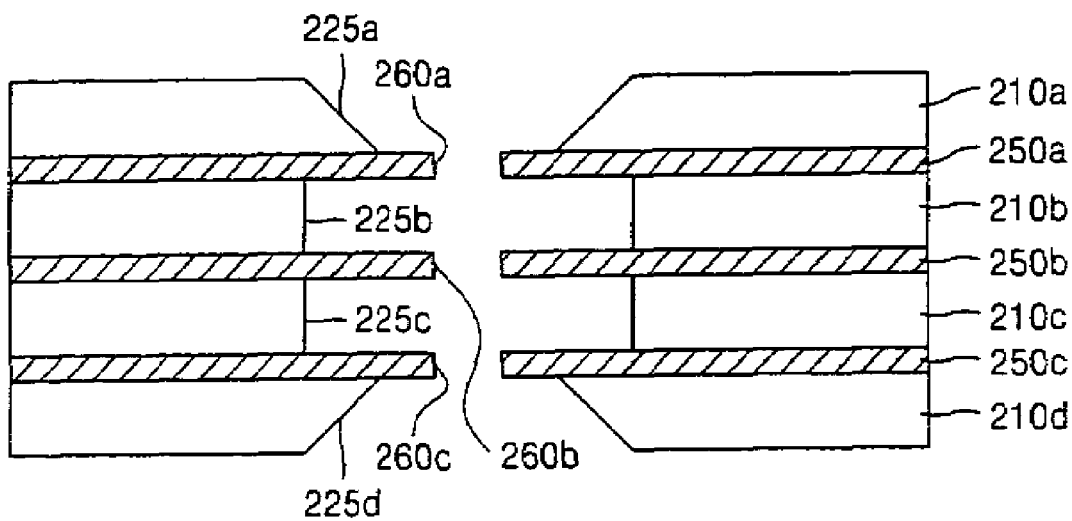
FIG. 16 is a cross-sectional view of an electron beam lens according to a second embodiment of the present invention.
Figure 17:
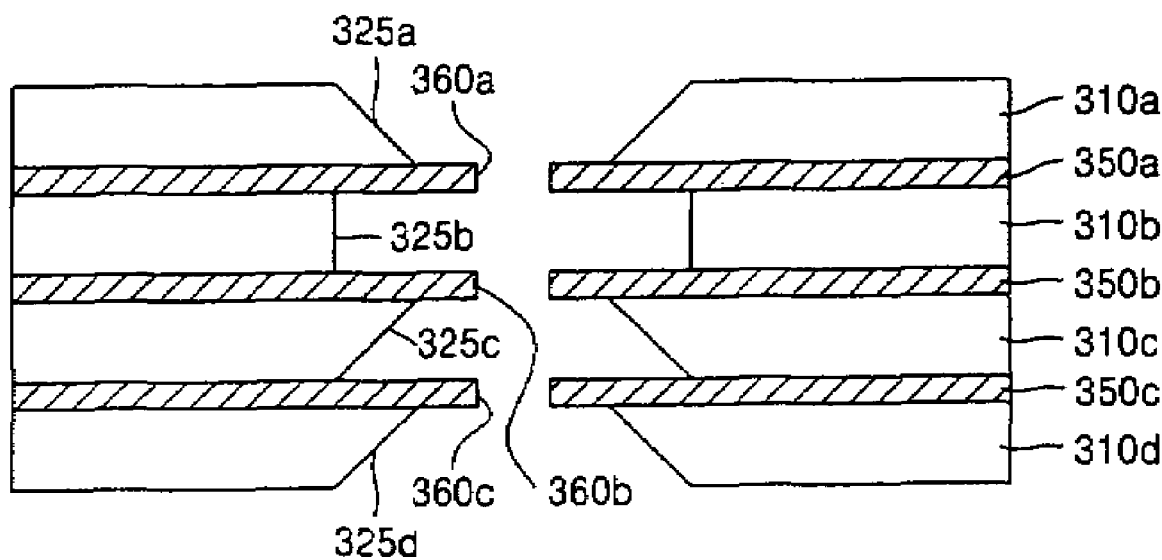
FIG. 17 is a cross-sectional view of an electron beam lens according to a third exemplary embodiment of the present invention.

According to the second and third exemplary embodiments of the present invention, electron beam lenses as illustrated in FIGS. 16 and 17 can be manufactured. The FIGS. 16 and 17 are examples of a source lens and a focus lens, respectively.

Referring to FIG. 16, a plurality of thin conductive films 250a, 250b, and 250c respectively having holes 260a, 260b, and 260c through which electron beam passes, are disposed in the central region of the source lens, and are disposed between the photosensitive glass substrates 210a, 210b, 210c, and 210d having hollowed spaces 225a, 225b, 225c, and 225d which have large areas than the area of the holes 260a, 260b, and 260c. The hollowed spaces 225a, 225b, 225c, and 225d are formed by etching activated portions formed by exposing the photosensitive glass substrates 210a, 210b, 210c, and 210d to a light. The first and fourth hollowed spaces 225a and 225d have a head-cut pyramid shape and the second and third hollowed spaces 225b and 225c have a cylindrical shape or a square column shape. The conductive thin films 250a, 250b, and 250c are plating layers grown on the photosensitive glass substrates 225a, 225b, 225c, and 225d. The center of the holes 260a, 260b, and 260c are self aligned along a center axis of electron beam.

Referring to FIG. 17, a plurality of thin conductive films 350a, 350b, and 350c respectively having holes 360a, 360b, and 360c through which electron beam passes, are disposed on the central region of the focus lens, and are disposed between the photosensitive glass substrates 310a, 310b, 310c, and 310d having hollowed spaces 325a, 325b, 325c, and 325d which have larger areas than the area of the holes 360a, 360b, and 360c. The hollowed spaces 325a, 325b, 325c, and 325d are formed by etching activated portions formed by exposing the photosensitive glass substrates 310a, 310b, 310c, and 310d to a light. The second hollowed space 325b has a cylindrical shape or a square column shape and the first, third, and fourth hollowed spaces 325a, 325b and 325d have a head-cut pyramid shape. The conductive thin films 350a, 350b, and 350c are plating layers grown on the photosensitive glass substrates 325a, 325b, 325c, and 325d. The center of the holes 360a, 360b, and 360c are self aligned along a center axis of electron beam.

The electron beam lenses illustrated in FIGS. 16 and 17 can be manufactured by further comprising protective films on both outer faces similar to the first and the third thin metal films 50' and 155' exposing the holes 60 and 165 in FIG. 12. Alternatively, the electron beam lenses illustrated in FIGS. 16 and 17 can be formed by stacking structures having a configuration as illustrated in FIG. 13.

According to the exemplary embodiment of the present invention, a single body electron beam lens in which holes formed in a plurality of thin metal films can be correctly aligned, and the thin metal films and a plurality of base isolation substrates are formed in a single body that does not require an additional bonding process, can be manufactured.

The electron beam according to the present invention is highly reproducible and provides structural safety because it is manufactured as a single body with correctly self aligned holes, thereby having a high durability. Since the electron beam lens can be manufactured using the plurality of thin films and base isolation substrates manufactured by repeatedly performing the same method, the electron beam lens according to the present invention enables to be able to manufacture a module of source lens, a focus lens, and further a single body electron beam lens.

The method of manufacturing the electron beam lens according to the exemplary embodiment of the present invention provides simplicity in a manufacturing process and a low manufacturing cost because a photosensitive glass substrate is used for a base isolation substrate material, a thin metal film is formed by a plating method that has a higher productivity, and a double side exposure apparatus is used to align centers of the thin films. The electron beam lens according to the exemplary embodiment of the present invention has a superior performance since the eccentricity and concentricity of the holes can be adequately formed, and because of efficiency in aligning and simplicity of manufacturing, productivity is increased.

While the present invention has been particularly shown and described with reference to exemplary embodiments thereof, it will be understood by those of ordinary skill in the art that various changes in form and details may be made therein without departing from the sprit and scope of the invention as defined by the appended claims.

What is claimed is:

1. A method of manufacturing an electron beam lens comprising:

focusing a light onto a region with a shape of a first hollowed space to form an activated region on a central portion of a first photosensitive glass substrate;

forming a first seed metal layer on a first surface of the first photosensitive glass substrate and forming a second seed metal layer on a second surface of the first photosensitive glass substrate;

forming a first resist pattern with a shape of a first hole on the first seed metal layer;

forming a second resist pattern with a shape of a second hole that is aligned with the first resist pattern on the second seed metal layer;

forming a first metal plating layer on a portion of the first seed metal layer exposed by the first resist pattern;

forming a second metal plating layer on a portion of the second seed metal layer exposed by the second resist pattern;

removing the first and the second resist patterns using a lift off method;

forming first and second thin metal films having the first hole and the second hole, respectively, by removing portions of the seed metal layers that were covered by the first and second resist patterns;

forming a first hollowed space by etching the activated region of the first photosensitive glass substrate;

focusing a light onto a region with a shape of a second hollowed space to form an activated region of a central portion of a second photosensitive glass substrate;

forming a third thin metal plating layer that exposes a second hollowed space on first surface of the second photosensitive glass substrate and forming a third seed metal layer on a second surface of the second photosensitive glass substrate;

bonding the second thin metal film of the first photosensitive glass substrate and the third thin metal film of the second photosensitive glass substrate using a eutectic bonding method;

forming a third resist pattern with a shape of a third hole that is aligned with the first and second resist patterns on the third seed metal layer;

forming a third metal plating layer on a portion of the third seed metal layer exposed by the third resist pattern;

removing the third resist pattern using a lift off method;

forming a third thin metal film having the third hole by removing a portion of the third seed metal layer that is covered by the third resist pattern; and forming a second hollowed space by etching the activated region of the second photosensitive glass substrate.

2. The method of claim 1, wherein the metal layer is formed of a metal selected from a group consisting of copper, a copper alloy, stainless steel, nickel, gold, silver, and platinum.

3. The method of claim 1, wherein the second resist pattern with the shape of the second hole that is aligned with the first resist pattern, and third resist pattern with a shape of the third hole that is aligned with the first and the second hole are formed by using a double side exposure apparatus.

4. The method of claim 1 further comprising
forming a protective film that exposes the holes on both outer surfaces of the thin metal film.

5. The method of claim 1, the first hollowed space and the second hollowed space are formed at the same time.

* * * * *